(12) United States Patent
Moon et al.

(10) Patent No.: US 7,889,818 B2
(45) Date of Patent: Feb. 15, 2011

(54) METHOD AND APPARATUS FOR CONTROLLING SAMPLING OF SIGNALS PRODUCED IN RELATION TO STORED DATA

(75) Inventors: Jaekyun Moon, Minneapolis, MN (US); Jaewook Lee, Minneapolis, MN (US)

(73) Assignees: Samsung Electronics Co., Ltd., Suwon-si, Gyeonggi-do (KR); Regents of the University of Minnesota, Minneapolis, MN (US)

( * ) Notice: Subject to any disclaimer, the term of this patent is extended or adjusted under 35 U.S.C. 154(b) by 1102 days.

(21) Appl. No.: 11/598,807

(22) Filed: Nov. 14, 2006

(65) Prior Publication Data

US 2008/0112513 A1    May 15, 2008

(51) Int. Cl.
   *H04L 27/06* (2006.01)
(52) U.S. Cl. .......................... 375/341; 375/371
(58) Field of Classification Search ............ 375/341, 375/371
   See application file for complete search history.

(56) References Cited

U.S. PATENT DOCUMENTS

| | | | | |
|---|---|---|---|---|
| 5,303,263 A | * | 4/1994 | Shoji et al. | 375/229 |
| 5,940,450 A | * | 8/1999 | Koslov et al. | 375/344 |
| 6,460,150 B1 | | 10/2002 | Cideciyan et al. | |
| 6,581,182 B1 | | 6/2003 | Lee | |
| 6,914,948 B2 | | 7/2005 | Kuki et al. | |
| 6,931,585 B1 | | 8/2005 | Burd et al. | |
| 2001/0043416 A1 | * | 11/2001 | Kato et al. | 360/40 |
| 2002/0063982 A1 | * | 5/2002 | Kim et al. | 360/26 |
| 2003/0152175 A1 | | 8/2003 | Kuki et al. | |

OTHER PUBLICATIONS

Chinese Patent Office, Office Action dated Sep. 8, 2010.

* cited by examiner

*Primary Examiner*—Shuwang Liu
*Assistant Examiner*—David Huang
(74) *Attorney, Agent, or Firm*—Volentine & Whitt, PLLC

(57) ABSTRACT

An estimated current phase error is used to control the oscillation frequency of a voltage controlled oscillator used to control the timing of sampling operations performed by an analog to digital converter (ADC). The current phase error is calculated by a recursive computation using a previous phase error in order to eliminate noise effects from the current phase error.

19 Claims, 10 Drawing Sheets

METHOD AND APPARATUS FOR CONTROLLING SAMPLING OF SIGNALS PRODUCED IN RELATION TO STORED DATA

BACKGROUND OF THE INVENTION

1. Field of the Invention

Embodiments of the invention relate generally to methods and apparatuses for controlling the timing used to sample signals produced in relation to data stored in a data storage medium such as a magnetic disk of a hard disk drive. More particularly, embodiments of the invention relate to methods and apparatuses for controlling the timing used to sample signals produced in relation to stored data based on a phase error calculated as a difference between an equalized signal and an estimated data signal, both generated in relation to the stored data.

2. Description of Related Art

A hard disk drive is an electronic device comprising a storage medium used to store information. As an example, a typical hard disk drive comprises a magnetic disk having concentric tracks capable of storing data. The magnetic disk is placed on a spin motor so that the disk can be rotated, and data stored on the disk is accessed by a head mounted on an actuator driven by a voice coil motor (VCM). The VCM rotates the actuator with a VCM driving current, and as a result, the head moves across the disk to access data.

The head reads information recorded on the surface of the disk by sensing changes in a magnetic field apparent on the surface of the disk, and the head stores information on the surface of the disk by generating a magnetic field in response to a write current supplied to the head. The magnetic field generated by the head causes the disk surface to be magnetized so that data is recorded or stored on the disk.

When the head reads information recorded on the surface of the disk, the magnetic field apparent on the surface of the disk produces a signal through the head. The signal is sampled through a sampling process and then converted into output data through a Viterbi decoding process.

Unfortunately, the accuracy of the output data tends to be very sensitive to the timing of the sampling process. As a result, variation in the timing of the sampling process tends to cause errors in the output data.

The timing of the sampling process is generally controlled by a sampling clock signal output by a voltage controlled oscillator (VCO), where the frequency of the sampling clock signal is derived from an oscillation frequency of the VCO. To stabilize the timing of the sampling process, the VCO relies on timing information recovered from the analog signal produced through the head to control its oscillation frequency.

In order to stably control the timing of the sampling process using conventional techniques, the tracking time required to compensate a timing offset (e.g., phase and/or frequency offsets) must be small, and the range of the timing offset that can be compensated, i.e., a pull-in range, must be wide.

Unfortunately, however, as the density of the recording medium increases, the signal-to-noise ratio of signals produced by the head of the hard disk drive tends to increase, and therefore it becomes increasingly difficult for conventional techniques to recover data encoded in those signals.

SUMMARY OF THE INVENTION

According to one embodiment of the invention, a method of calculating a current phase error between an equalized signal and an estimated data signal is provided. The current phase error is used to control the timing of a sampling process in a system adapted to reproduce a signal transmitted through a communication channel by sampling, equalizing, and Viterbi decoding the signal. The method comprises recursively applying a previous phase error to a calculation of the current phase error to eliminate effects of noise from the current phase error.

According to another embodiment of the invention, a signal reproducing apparatus is provided. The apparatus comprises an analog-to-digital converter (ADC) adapted to sample a signal transmitted through a communication channel to produce a sampled signal, an equalizer adapted to equalize the sampled signal to produce an equalized signal, a data estimator adapted to estimate a value of the signal transmitted through the communication channel based on the equalized signal to produce and estimated signal, a phase estimator adapted to calculate a current phase error between the equalized signal and the estimated signal, and a loop filter adapted to control an oscillation frequency of an oscillator adapted to generate a sampling clock for the ADC based on the current phase error calculated by the phase estimator. The phase estimator calculates the current phase error based on a previous phase error.

According to still another embodiment of the invention, a method of reproducing a signal transmitted through a communication channel is provided. The method comprises sampling the transmitted signal to produce a sampled signal, equalizing the sampled signal to produce an equalized signal, and Viterbi decoding the equalized signal to produce an estimated data signal. The Viterbi decoding comprises calculating branch metrics based on estimated phase errors of the equalized signal. The method further comprises calculating additional estimated phase errors based on the calculated branch metrics, calculating an estimated phase error used in a loop filter based on a phase estimate value corresponding to a survival path selected during the Viterbi decoding, and controlling a sampling time used to sample the transmitted signal based on the estimated phase error used in the loop filter.

According to yet another embodiment of the invention, ae signal reproducing apparatus comprises an analog-to-digital converter (ADC) adapted to sample a signal transmitted through a communication channel to produce a sampled signal, an equalizer adapted to equalize the sampled signal to produce an equalized signal, a branch metric calculator & phase compensator (BMC) adapted to calculate branch metrics based on the equalized signal and corresponding estimated phase errors and to output the branch metrics and corresponding estimated phase values, an add compare selection & path memory (ACS & PM) adapted to compute path metrics based on the branch metrics and estimated phase values output by the BMC and to output an estimated data signal and a previous estimated phase error based on a survival path derived from the path metrics, a phase estimator adapted to calculate a current estimated phase error to be applied to the BMC based on the previous estimated phase error output by the ACS & PM, and a loop filter adapted to control an oscillation frequency of an oscillator used to control the timing of the sampling performed by the ADC. The loop filter controls the oscillation frequency based on the previous estimated phase error output by the ACS & PM.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
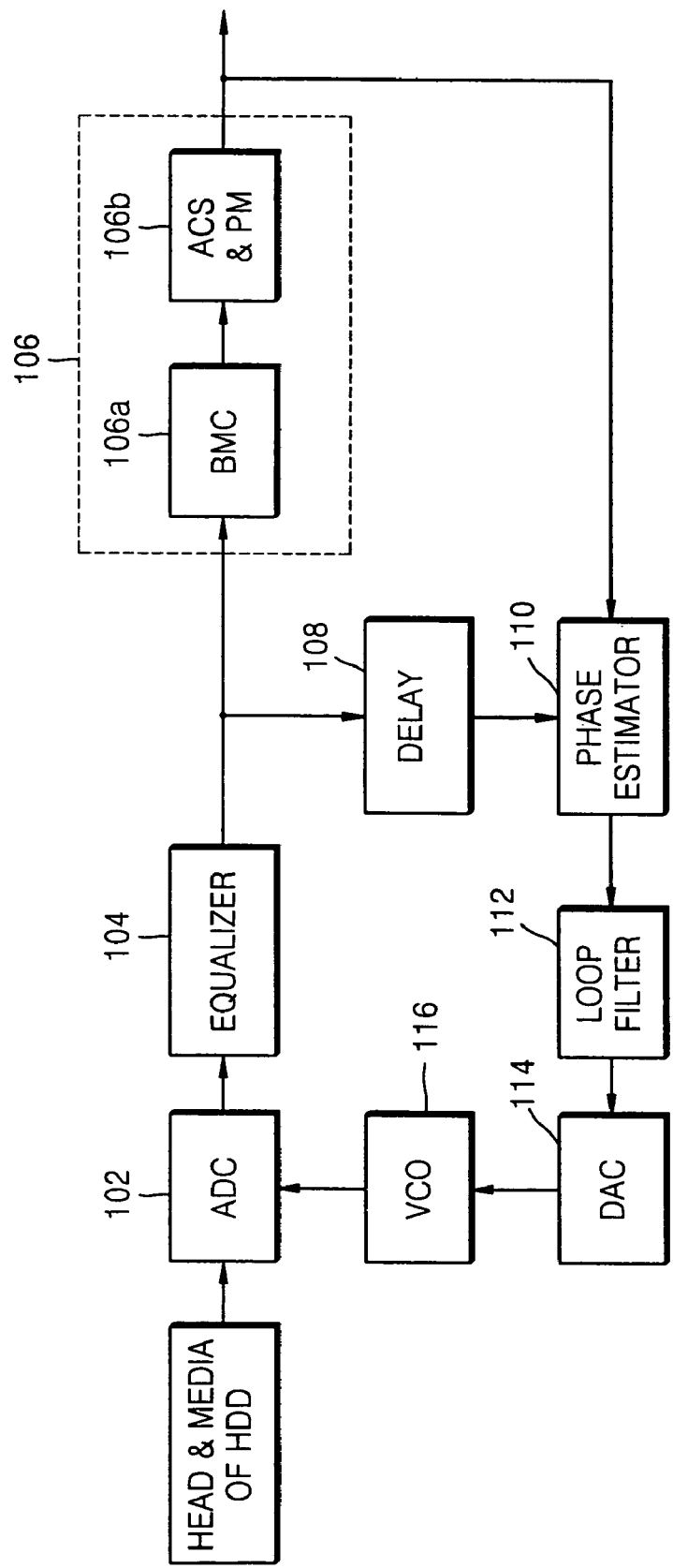
FIG. 1 is a block diagram of a signal reproducing apparatus according to one embodiment of the present invention.

FIG. 1 is a block diagram of a signal reproducing apparatus according to an embodiment of the present invention.

Referring to FIG. 1, the signal reproducing apparatus comprises an analog-to-digital converter (ADC) 102, an equalizer 104, a data estimator 106, a delay unit 108, a phase estimator 110, a loop filter 112, a digital-to-analog converter (DAC) 114, and a voltage controlled oscillator (VCO) 116. Data estimator 106 comprises a branch metric calculation circuit (BMC) 106a, and an add compare selection & path memory circuit (ACS & PM) 106b.

ADC 102 receives and samples an analog input signal generated in relation to data stored in a data storage medium such as a magnetic disk in a hard disk drive. The input signal is typically produced by the operation of a head of the hard disk drive and transferred to ADC 102 through the head. By sampling the input signal, ADC 102 produces a sampled input signal. Equalizer 104 receives and reshapes the sampled input signal and outputs a resulting equalized signal.

Data estimator 106 performs a Viterbi decoding operation on the equalized signal to produce an estimated data signal based on the data stored in the hard disk drive. In general, the Viterbi decoding operation is performed by computing branch metrics for a sequence of data inputs and then accumulating the branch metrics to form path metrics. In data estimator 106, BMC 106a computes the branch metrics for the Viterbi decoding operation and ACS & PM 106b computes the path metrics.

Although data estimator 106 uses a Viterbi decoding operation in selected embodiments of the invention, variations of the Viterbi algorithm and other similar operations can be used to decode data received by data estimator 106.

Delay unit 108 delays the equalized signal output by equalizer 104 and outputs a delayed signal to phase estimator 110. Phase estimator 110 calculates an estimated phase error by comparing the delayed signal output by delay unit 108 with the estimated data signal produced by data estimator 106.

Loop filter 112 generates a control signal corresponding to the estimated phase error output from phase estimator 110. DAC 114 converts the control signal generated by loop filter 112 into an analog control signal, and the analog control signal is used to control the oscillation frequency of VCO 116. Based on the oscillation frequency, VCO 116 generates a clock signal for controlling the sampling operation performed by ADC 102.

ADC 102 performs the sampling operation in synchronization with the clock signal generated by VCO 116. Accordingly, the timing of the sampling operation can be adjusted to compensate for phase error by controlling the oscillation frequency of VCO 116 based on the estimated phase error output by phase estimator 110.

Figure 2:
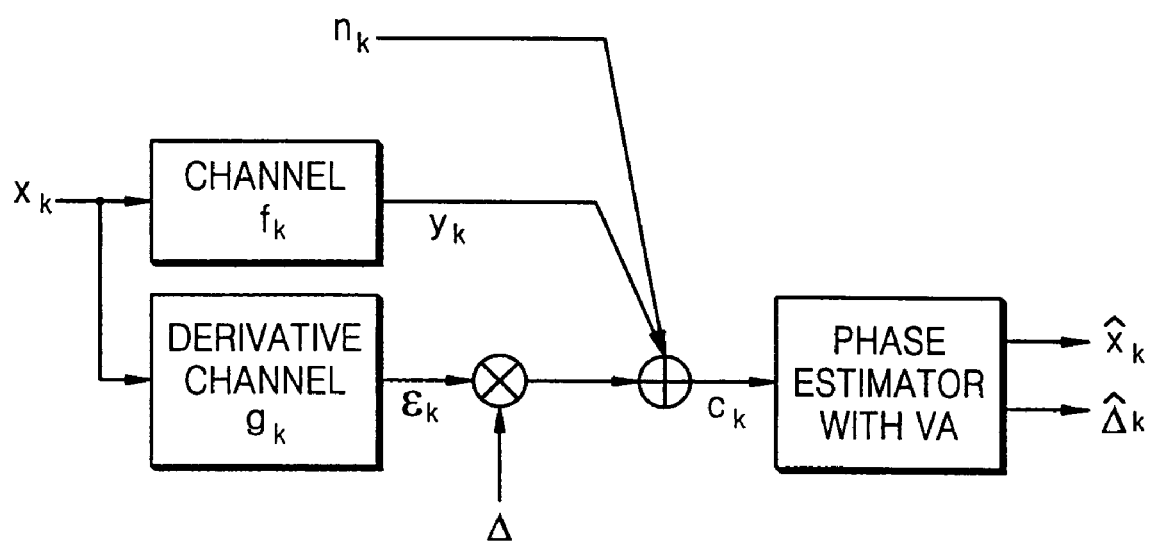
FIG. 2 is a schematic diagram illustrating a channel model for a phase estimator according to an embodiment of the present invention.

FIG. 2 is a schematic diagram illustrating a model of a communication channel between the data storage medium and a phase estimator that uses the Viterbi Algorithm to decode data received through the communication channel. In FIG. 2, the phase estimator is labeled as "phase estimator with Viterbi Algorithm (VA)" and it performs various functions that will be described below in relation to elements 306, 308, and 310 in FIG. 3.

Referring to FIG. 2, the term $x_k$ denotes stored binary data (bit data) input to the communication channel from the data storage medium during a k-th clock cycle. The term $y_k$ denotes binary data output by an effective communication channel during the k-th clock cycle. The term $\epsilon_k$ denotes binary data output from a derivative communication channel during the k-th clock cycle. The term $\Delta$ denotes a phase error in the output $\epsilon_k$ of the derivative communication channel relative to the output $y_k$ of the effective communication channel. The term $n_k$ denotes additive noise such as additive white Gaussian noise during the k-th clock cycle. The term $c_k$ represents data produced by the communication channel in the k-th clock cycle and input to the phase estimator with VA. The term $c_k$ incorporates the additive noise $n_k$ and distortion resulting from phase error $\Delta$.

Binary data $y_k$ is generated by convolution of binary data $x_k$ with the impulse response of the effective communication channel and binary data $\epsilon_k$ is generated by convolution of binary data $x_k$ with the impulse response of the derivative communication channel. Since binary data $y_k$ is generated by a convolution operation that does not take into account noise and delay in the communication channel, the term $y_k$ may also be referred to as an "ideal candidate signal".

Branch metrics used in the Viterbi decoding operation can be calculated in BMC 106a as a squared Euclidean distance $\lambda_k$ expressed by the following equation (1):

$$\lambda_k = (y_k - c_k)^2. \quad (1)$$

Each branch metric corresponds to a potential state transition of decoded data during the k-th clock cycle. More particularly, each branch metric is a squared Euclidean distance at each branch of a Viterbi trellis. Each branch metric represents a distance between the data $c_k$ and a particular candidate $y_k$. The ideal candidate signal $y_k$ changes according to different branches in the Viterbi trellis. Where the input signal $c_k$ is similar to a particular candidate $y_k$, the Euclidean distance in equation (1) will be small.

In FIG. 2, the term $f_k$ represents the impulse response or channel characteristic of the effective communication channel. The term $g_k$ represents the impulse response or channel characteristic of the derivative communication channel. The purpose of the derivative communication channel and its associated impulse response $g_k$ is to model signal distortion resulting from phase error.

The impulse response $f_k$ of the effective communication channel depends on properties of a recording and/or reproducing system used to generate signals from the stored binary data input to the communication channel. The impulse response $g_k$ of the derivative communication channel is obtained by differentiating the impulse response $f_k$ of the effective communication channel.

The term $\hat{x}_k$ denotes Viterbi decoded data produced by the communication channel in the k-th clock cycle, and the term $\hat{\Delta}_k$ denotes an estimated phase error of output data $c_k$ in the k-th clock cycle. The term $\hat{\Delta}_k$ is an estimate of phase error $\Delta$ and the term $\hat{x}_k$ is an estimate of binary data $x_k$. In one implementation, binary output data $\epsilon_k$ from the derivative communication channel is computed from Viterbi decoded data $\hat{x}_k$. Alternatively, binary output data $\epsilon_k$ may comprise a value derived from a branch metric corresponding to a state transition in BMC 106a.

As an example, $\epsilon_k$ can generally be computed using binary data $x_k$ and impulse response $g_k$ of the derivative communication channel. Impulse response $g_k$ is typically known but data $x_k$ is not known. There are various approaches for computing binary data $x_k$. For example, a first approach is to use Viterbi decoded data $\hat{x}_k$ in place of binary data $x_k$. A second approach is to use transition information $\tilde{a}_k$ in a Viterbi trellis such as that illustrated in FIG. 4 because all the branches have their own unique data candidate sequences.

According to selected embodiments of the invention, a previous phase error and a current phase estimate value are used in combination to reduce the effects of noise in the communication channel.

For example, in phase estimator 110, estimated phase error $\hat{\Delta}_k$ in the k-th clock cycle can be expressed by the following equation (2):

$$\hat{\Delta}_k = \hat{\Delta}_{k-1} + \gamma(e_k \epsilon_k - e_{k-M} \epsilon_{k-M}). \tag{2}$$

In equation (2), the term $\hat{\Delta}_{k-1}$ denotes an estimated phase error in the (k−1)-th clock cycle, $e_k$ denotes an error signal, $\gamma$ is a constant that depends on the impulse response $g_k$ of the derivative communication channel, and M denotes a number of clock cycles previous to the k-th clock cycle. Error signal $e_k$ can be computed by the equation $e_k = c_k - y_k$, binary data $y_k$ output from the effective communication channel can be computed as $y_k = \Sigma f_i \times x_{k-i}$, derivative channel output data $\epsilon_k$ can be computed as $$\varepsilon_k = \sum_i g_i \times x_{k-i},$$

and $\gamma$ can be computed as $$\gamma = \frac{1}{\sum_{i=k-M}^{k-1} \varepsilon_i^2}.$$

In equation (2), the term $\gamma(e_k \epsilon_k - e_{k-M} \epsilon_{k-M})$ can be thought of as an integrated (or summed) value based on previous outputs of the derivative channel.

A typical hard disk drive has a channel length of 4. In other words, where there is inter-symbol interference (ISI) in the channel, a signal response spreads to multiple sampling positions. In particular, a length-4 "$1 + 2D + 2D^2 + D^3$" partial response (PR) channel produces response '1' at time k, '2' at time k+1, '2' at time k+2, and '1' at k+3. A final signal output from the channel will be a sum of the partial responses generated at different times.

The derivative channel is the derivative of the continuous-time representation of the PR channel, and therefore it typically has a greater length than the PR channel length. For explanation purposes, it will be assumed that the derivative channel has a length of 6. Accordingly, it will be assumed that binary data $y_k$ has a length of 4, and that binary data $\epsilon_k$ has a length of 6. However, the channel length of the hard disk drive may increase as the recoding density of the hard disk drive increases. The respective values of binary data $y_k$ and $\epsilon_k$ tend to increase as the recording density of the hard disk drive increases.

In equation (2), previous estimated phase error $\hat{\Delta}_{k-1}$, is used to compute current estimated phase error $\hat{\Delta}_k$. In other words, estimated phase error $\hat{\Delta}_k$ is computed in a recursive manner. The recursive structure of equation (2) tends to reduce the effect of noise on the estimated phase error calculation, and can also reduce the associated computational complexity. To illustrate how the recursive structure of equation (2) reduces the effect of noise, the recursive structure is equivalent to averaging data from time index 'k−M+1' to 'k', i.e. from $e_{k-M+1} \epsilon_{k-M+1}$ to $e_k \epsilon_k$. The averaging function lessens the effect of random noise with mean zero.

In addition, the recursive structure of equation (2) is similar to that of a branch metric calculation or a path metric calculation, and therefore techniques similar to those used in Viterbi decoding can be applied to phase estimator 110.

The term $\gamma(e_k \epsilon_k - e_{k-M} \epsilon_{k-M})$ in equation (2) expresses a difference between a current phase estimation value $e_k \epsilon_k$ and a previous phase estimation value $e_{k-M} \epsilon_{k-M}$, multiplied by the constant $\gamma$. The use of the previous phase estimation value tends to reduce the effects of noise in the phase error computation. Equation (2) computes a value of estimated phase error $\hat{\Delta}_k$ that minimizes a squared error between $e_i = c_i - y_i$ and $\hat{\Delta}_k \epsilon_k$ over an observation window of M samples.

Tracking performance can be adjusted by adjusting the size of M in based on variation of the estimated phase error. For example, by monitoring changes in the estimated phase error, the tracking performance can be adjusted by causing the value of M to automatically adjust in relation to variation in the estimated phase error. It is also possible to adjust the value of M in relation to tradeoffs between a desired noise tolerance level and desired system performance. Such adjustments to the value of M can be determined, for example, through simulation.

The value of $\gamma$ is typically determined in relation to the value of M and the output of the derivative channel. Appropriate adjustments to the value of $\gamma$ can serve to reduce the effects of noise on the calculation of the estimated phase error.

Hardware for implementing equation (2) typically requires a structure for storing M previous phase error estimates. As a result, the complexity of the hardware increases as the value of M increases. However, the complexity of the hardware can be reduced by modifying equation (2) to obtain the following equation (3):

$$\hat{\Delta}_k = \mu \hat{\Delta}_{k-1} + \gamma e_k \epsilon_k. \tag{3}$$

In equation (3), $\mu$ is a forgetting factor determined with respect to the value of M. Forgetting factor $\mu$ can be computed, for example, as $$\mu = \frac{M-1}{M}.$$

Figure 3:
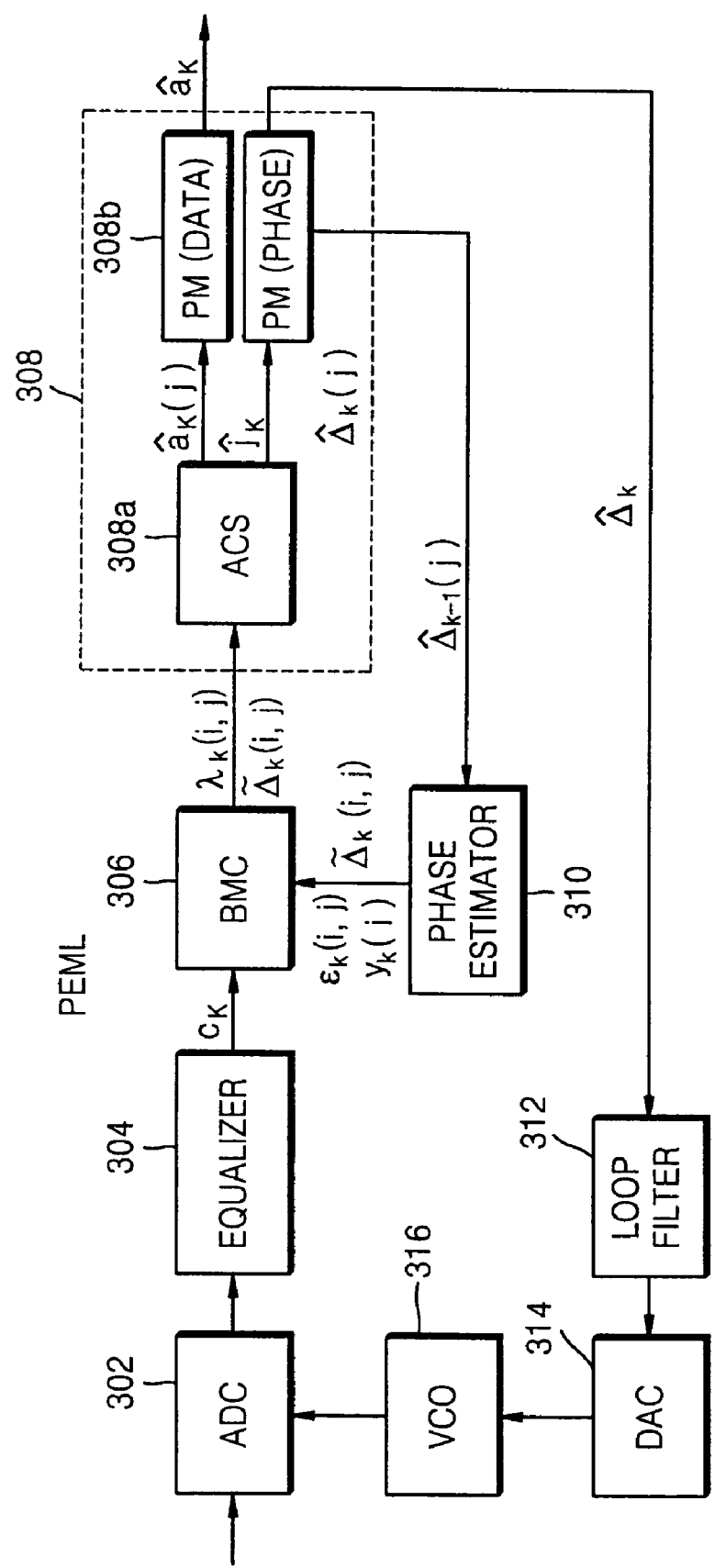
FIG. 3 is a block diagram of a signal reproducing apparatus according to an embodiment of the present invention.

FIG. 3 is a block diagram of a signal reproducing apparatus according to another embodiment of the present invention.

Referring to FIG. 3, the apparatus comprises an analog-to-digital converter (ADC) 302, an equalizer 304, a branch metric calculation & phase compensation circuit (BMC) 306, an add compare selection & path memory circuit (ACS & PM) 308, a phase estimator 310, a loop filter 312, a digital-to-analog converter (DAC) 314, and a voltage controlled oscillator (VCO) 316. ACS&PM 308 comprises an add compare selector (ACS) 308a, a data path memory 308b and a phase path memory 308c.

ADC 302 receives and samples an input signal generated in relation to a data storage medium such as a magnetic disk of a hard disk drive. Typically, the input signal is produced through a head of the hard disk drive. The input signal is sampled by ADC 302 to produce a sampled input signal, and the sampled input signal is then shaped by equalizer 304 to produce a signal $c_k$.

BMC 306 calculates branch metrics for the signal $c_k$ by applying corresponding estimated phase error values to each branch of a Viterbi trellis or other similar data structure. An example of a branch metric that could be used by BMC 306 is a Euclidean distance. An example of a Euclidean distance is provided by the following equation (4):

$$\lambda_k = (y_k - c_k - \epsilon_k \hat{\Delta}_k)^2. \quad (4)$$

In equation (4), $\hat{\Delta}_k$ is an estimated phase error value obtained using equation (2) or (3). By using estimated phase error value $\hat{\Delta}_k$ to obtain $\lambda_k$, the reliability of a Viterbi decoding operation using $\lambda_k$ for a branch metric tends to increase relative to Viterbi decoding operations that do not incorporate estimated phase error $\hat{\Delta}_k$ into the branch metric computation.

In FIG. 3, the indices "i" and "j" are used to denote current and next states in a Viterbi trellis, respectively. For example, in FIG. 4, states "i" and "j" are drawn from among the states "11111", "11110", ..., "00000". To illustrate the use of states "i" and "j" the term $\lambda_{10}(11111,01111)$ is a branch metric at time "k=10" for a branch between "11111" and "01111".

Figure 4:
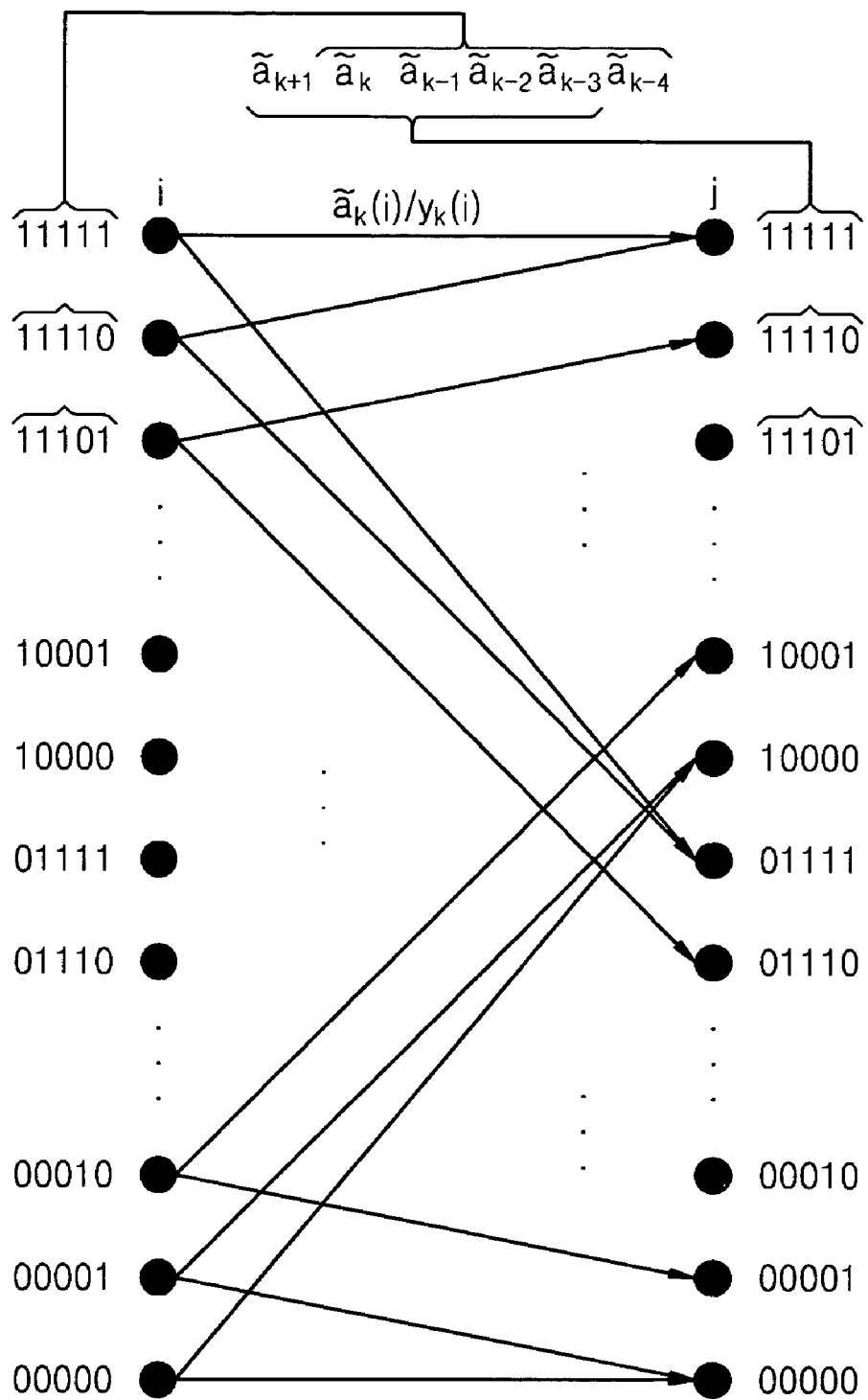
FIG. 4 shows a Viterbi trellis of a length-4 channel (length-6 derivative channel)

The term $y_k(j)$ represents an ideal channel output at time "k" to state "j" in FIG. 4. For example, $y_{10}(11111)$ is an ideal channel output at time "k=10" related to two branches from states "11111" or "11110" to state "11111". Similarly, the term $c_k(j)$ represents a value of the term $c_k$ at time "k" and state "j" of the Viterbi trellis.

The term $\epsilon_k(i,j)$ represents the output of the derivative channel at time "k" relative to a branch from "i" to "j" in FIG. 4. The term $\hat{j}_k$ represents a state having the minimum branch metric among all the states at time "k" in FIG. 4. The term $\hat{a}_k$ represents an estimate of binary data used to produce the signal $c_k$. In particular, the term $\hat{a}_k$ represents the same data as the term $\hat{x}_k$ described above.

The term $\tilde{\Delta}_k(i,j)$ represents an estimated phase at time "k" at branch from "i" to "j" in FIG. 4. The term $\hat{\Delta}_k(j)$ represents an estimated phase error for a survivor path ending in state "j" at time "k" and chosen from $\tilde{\Delta}_k(i,j)$.

To compute the branch metric $\lambda_k$ for a branch of a Viterbi trellis, equation (4) can be expressed as $\lambda_k(i,j) = (y_k(j) - c_k(j) - \epsilon_k(i,j)\hat{\Delta}_k)^2$.

ACS & PM 308 calculates estimated phase error values $\hat{\Delta}_k$ from the output of BMC 306. ACS & PM 308 also determines survival paths in a Viterbi decoding operation. Once a survival path is determined, a corresponding estimated previous phase error is provided to phase estimator 310 based on the survival path. Phase estimator 310 typically calculates new estimated phase error values using corresponding previous estimated phase error values according to equation (2) or (3).

ACS & PM 308 includes phase path memory 308c for storing all of the estimated phase error values $\hat{\Delta}_k$ used in the Viterbi decoding operation. ACS & PM 308 stores estimated phase error values $\hat{\Delta}_k$ in phase path memory 308c and outputs only an optimum estimated phase error corresponding to a survival path to loop filter 312.

The operation of ACS & PM 308 is described in further detail below.

FIG. 4 shows a Viterbi trellis for a communication channel with a channel length of 4. A related derivative communication channel has a channel length of 6.

Phase estimator 310 calculates $y_k(i)$, $\epsilon_k(i,j)$ and $\tilde{\Delta}_k(i,j)$ based on the Viterbi trellis illustrated in FIG. 4 and according to equations (5)-(8) below. Phase estimator 310 then sends $y_k(i)$, $\epsilon_k(i,j)$, and $\tilde{\Delta}_k(i,j)$ to BMC 306.

The Viterbi trellis of FIG. 4 is applied to a length-4 channel which is mostly used. A derivative communication channel corresponding to the length-4 channel is a length-6 channel. State values "i" and "j" in FIG. 4 range between 0 and 31 (00000~11111 in binary values). 5-bit states are used as an example in FIG. 4 because 5-bit codewords are commonly used in many contemporary data storage applications.

The terms $y_k(i)$, $\epsilon_k(i,j)$, and $\tilde{\Delta}_k(i,j)$ are functions of "i" and "j" and they correspond to branches of the Viterbi trellis. The term $y_k(i)$ can be computed by the following equation (5):

$$y_k(i) = \sum_{m=1}^{4} f_m(2\tilde{a}_{k-m+1}(i) - 1). \quad (5)$$

In equation (5), "k" represents a current time, and the term $\tilde{a}_{k-m+1}$ represents binary sequences determined by the Viterbi trellis, and $y_k(i)$ represents the ideal channel response without noise and timing distortions.

The term $\epsilon_k(i,j)$ can be computed by the following equation (6):

$$\varepsilon_k(i,j) = g_0(2\tilde{a}_{k+1}(j) - 1) + \sum_{n=1}^{5} g_n(2\tilde{a}_{k-n+1}(i) - 1). \quad (6)$$

The term $\tilde{\Delta}_k(i,j)$ can be computed by the following equations (7) or (8):

$$\tilde{\Delta}_k(i,j) = \hat{\Delta}_{k-1}(i) + \gamma[e_k(i)\epsilon_k(i,j) - e_{k-M}(i)\epsilon_{k-M}(i,j)] \quad (7)$$

$$\tilde{\Delta}_k(i,j) = \mu\hat{\Delta}_{k-1}(i) + \gamma e_k(i)\epsilon_k(i,j). \quad (8)$$

The error term $e(i,j)$ in equations (7) and (8) can be computed by the following equation (9):

$$e_k(i,j) = c_k - y_k(i). \quad (9)$$

BMC 306 calculates $\lambda_k(i,j)$ using $y_k(i)$, $\epsilon_k(i,j)$, and $\tilde{\Delta}_k(i,j)$, which are output by phase estimator 310, based on an equation (10) below and the Viterbi trellis shown in FIG. 5.

BMC 306 then sends $\lambda_k(i,j)$ to ACS&PM 308 with $\tilde{\Delta}_k(i,j)$. Like equations (7) through (9), the branch metric $\lambda_k(i,j)$ is a function of 'i' and 'j' and is calculated for every branch of the Viterbi trellis. Branch metric $\lambda_k(i,j)$ can be computed by the following equation (10):

$$\lambda_k(i,j) = [c_k - y_k(i) - \epsilon_k(i,j)\tilde{\Delta}_k(i,j)]^2 \qquad (10)$$

ACS 308a calculates $\hat{a}_k(j), \hat{\Delta}_k(j), \hat{i}_k$ using $\lambda_k(i,j)$ and $\tilde{\Delta}_k(i,j)$, which are output by BMC 306, and sends $\hat{a}_k(j)$ and $\hat{j}_k$ to data path memory 308b, and sends $\hat{\Delta}_k(j)$ and $\hat{j}_k$ to phase path memory 308c. Here, both of $\hat{a}_k(j)$ and $\hat{\Delta}_k(j)$ are functions of 'j' and have a plurality of values which are calculated for every state of the Viterbi trellis. The terms $\hat{a}_k(j), \hat{\Delta}_k(j), \hat{j}_k$ are computed using the following equations (11) through (15):

$$\hat{i}_k(j) = \min_i[sm_{k-1}(i) + \lambda_k(i,j)] \qquad (11)$$

$$sm_k(j) = sm_{k-1}(\hat{i}_k(j)) + \lambda_k(\hat{i}_k(j), j) \qquad (12)$$

$$\hat{a}_k(j) = \tilde{a}_k(j) \qquad (13)$$

$$\hat{\Delta}_k(j) = \tilde{\Delta}_k(\hat{i}_k(j), j) \qquad (14)$$

$$\hat{j}_k = \min_j sm_{k(j)}. \qquad (15)$$

Data path memory 308b updates path memory values $\hat{a}_{k-x-1}(j)$ with length L for data estimation by $\hat{a}_k(j), \hat{\Delta}_k(j), \hat{j}_k$, which are sent from ACS 308a, based on equations (16) and (17) below and the Viterbi trellis shown in FIG. 4.

In the meantime, phase path memory 308c updates path memory values $\hat{\Delta}_{k-x-1}(j)$ with length P for phase estimation by $\hat{a}_k(j), \hat{\Delta}_k(j), \hat{j}_k$, which are sent from the ACS 308a, based on equations (18) and (19) and the Viterbi trellis shown in FIG. 4.

Here, 'L' and 'P' are optimized for data estimation and phase estimation, respectively.

$$\hat{a}_{k-x-1}(j) = \hat{a}_{k-x}(\hat{i}_k(j)), \forall x \in \{0, 1, \ldots, L-1\} \qquad (16)$$

$$\hat{a}_k = \hat{a}_{k-L+1}(\hat{j}_k) \qquad (17)$$

$$\hat{\Delta}_{k-x-1}(j) = \hat{\Delta}_{k-x}(\hat{i}_k(j)), \forall x \in \{0, 1, \ldots, P-1\} \qquad (18)$$

$$\hat{\Delta}_k = \hat{\Delta}_{k-P+1}(\hat{j}_k) \qquad (19)$$

Figure 5:
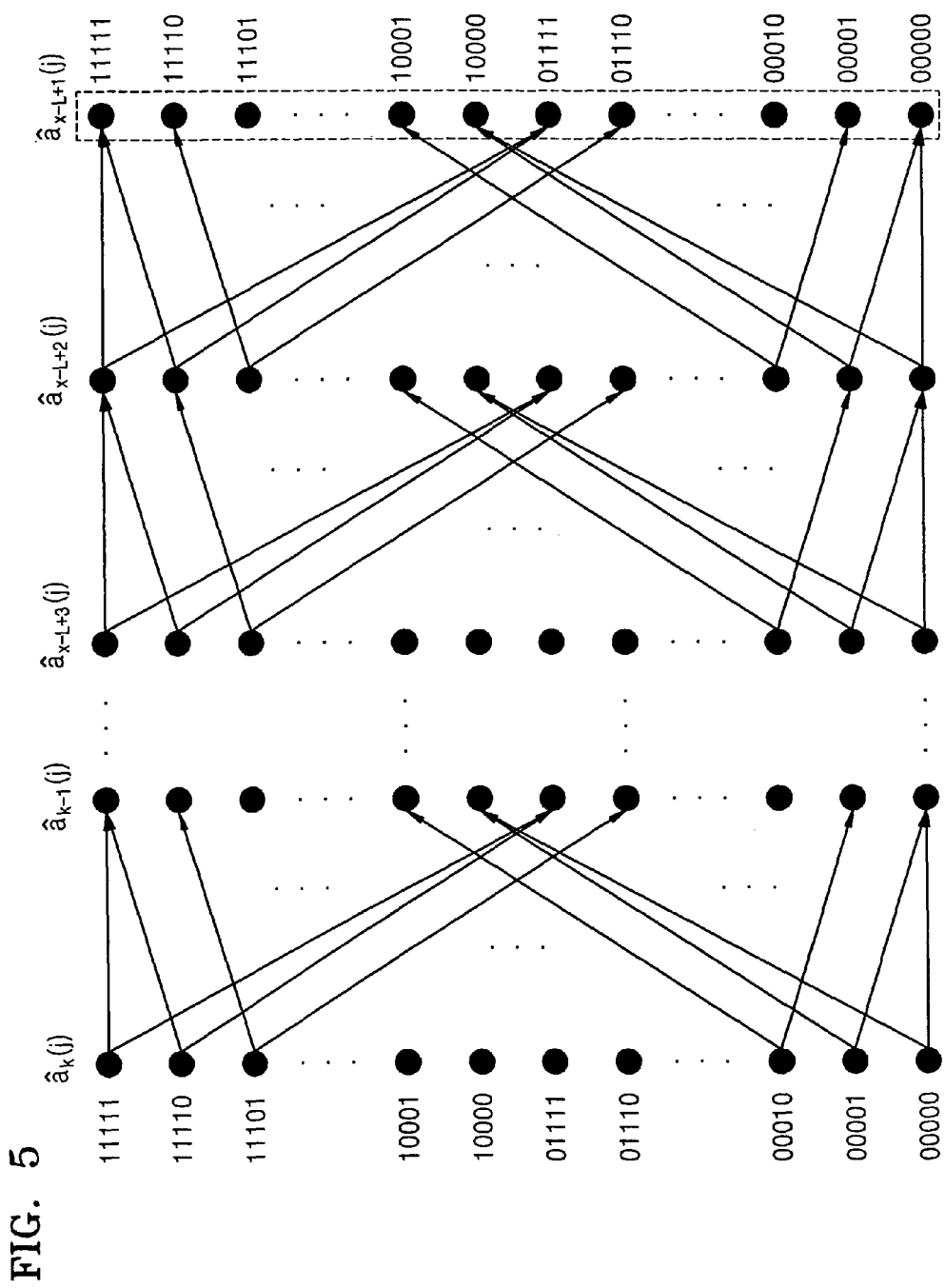
FIG. 5 shows a schematic structure of a data path memory with a length L for data estimation.

FIG. 5 shows a schematic structure of data path memory 308b with length L for data estimation, which is constructed based on the Viterbi trellis shown in FIG. 4. Data path memory 308b determines an optimum data estimate value $\hat{a}_k$, which corresponds to a survival path data_sp among data paths with length L. Here, $\hat{a}_k$ is a binary data with a binary value of '1' or '0'.

Figure 6:
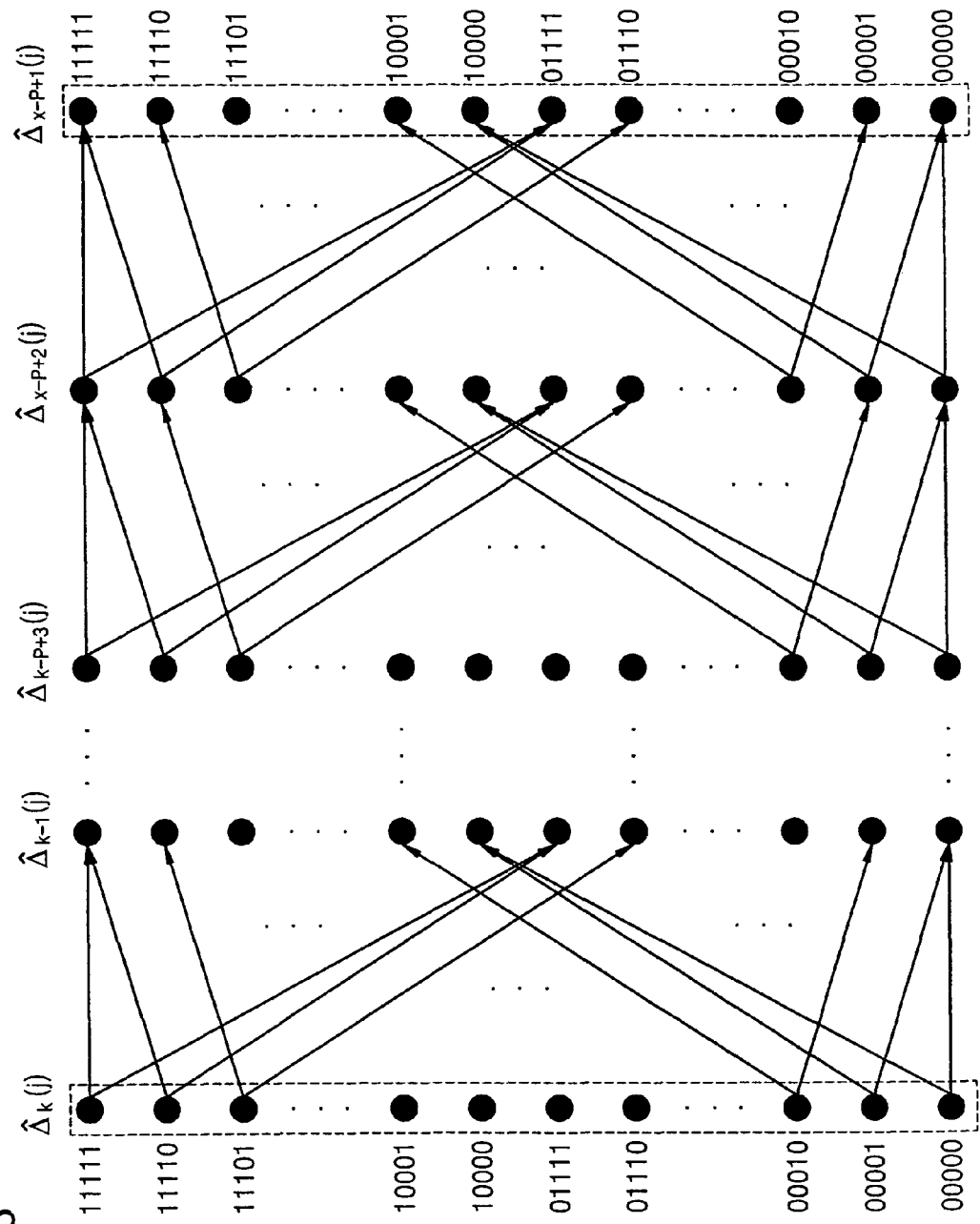
FIG. 6 shows a schematic structure of a phase path memory with a length P for phase estimation.

FIG. 6 shows a schematic structure of phase path memory 308c with length P for phase estimation, which is constructed based on the Viterbi trellis shown in FIG. 4. Phase path memory 308c determines an optimum phase estimate value $\hat{\Delta}_k$, which corresponds to a survival path phase_sp among phase paths with length P. The optimum phase estimate value $\hat{\Delta}_k$ is sent to loop filter 312.

Further, ACS&PM 308 delays $\hat{\Delta}_k(j)$, which was an input to phase memory 308c at the previous cycle, by a cycle, and sends delayed $\hat{\Delta}_k(j)$ to phase estimator 310 as $\hat{\Delta}_{k-1}(j)$. Here, $\hat{\Delta}_{k-1}(j)$ is a function of 'j' and is not a single value but a plurality of values which are calculated for every state of the Viterbi trellis.

Equations (2) and (14), which both compute estimated phase error, are similar in that they both have a recursive structure. Further, since the phase estimation is performed in similar manner for the data estimation, a plurality of $sm_k(j)$ and $\tilde{\Delta}_k(i, j)$ are calculated based on the Viterbi trellis shown in FIG. 4.

Data path memory 308b, shown in FIG. 5, stores binary data $\hat{a}_k(j)$ for L cycles and outputs a value, which corresponds to a survival path.

In the mean time, phase path memory 308c, shown in FIG. 6, stores floating-point data $\hat{\Delta}_k(j)$ for P cycles and outputs $\hat{\Delta}_k$, which corresponds to a survival phase to loop filter 312. At the same time, phase path memory 308c sends $\hat{\Delta}_k(j)$ to phase estimator 310 as $\hat{\Delta}_{k-1}(j)$ after 1 cycle so that it is used to calculate $\tilde{\Delta}_k(i, j)$.

An optimum value $\hat{\Delta}_k = \hat{\Delta}_{k-P+1}(\text{phase\_sp}_k)$ among $\hat{\Delta}_{k-P+1}(j)$, which are shown as dashed line boxes in the right side of FIG. 6, is selected and output to loop filter 310. The term $\hat{\Delta}_k(j)$ represents a correct value which is determined after P cycles and $\hat{\Delta}_{k-1}(j)$ are values of which $\hat{\Delta}_k(j)$ are delayed by 1 cycle. That is, the terms $\hat{\Delta}_{k-1}(j)$ are candidate values of phase estimate value corresponding to every state of the Viterbi trellis.

In selected embodiments of the invention, equations with a recursive structure are used to calculate phase error $\hat{\Delta}_k$, similar to path metric calculation equations of a Viterbi decoder. Accordingly, a phase error $\hat{\Delta}_k$ can be calculated in a manner similar to conventional path metric calculations.

Finally, determination of one phase error $\hat{\Delta}_k$ is also performed using the path memory in a similar manner to data detection performed by a Viterbi decoder.

Channel characteristic $f_k$ is typically determined in accordance with a system, and derivative channel characteristic $g_k$ is obtained by differentiating channel characteristic $f_k$. Accordingly, where channel characteristic $f_k$ is known, derivative channel characteristic $g_k$ can be readily obtained.

Generally, where impulse response $f_k$ is differentiated, a characteristic value to express the impulse response increases. For instance, in one example, the length of a channel in a hard disk drive is 4, but the length of a channel obtained through differentiation of the length 4 channel is 6. The number of states in a Viterbi decoder is determined by the length of a channel, and the number of states for a channel whose length is 4 is $2^4 = 16$, and the number of states for a derivative channel whose length is 6 is $2^6 = 64$. Where the number of states is determined on the basis of a derivative channel whose length is longer, the states of channels whose length is shorter is all considered naturally.

However, in other cases, such as where the number of states is determined on the basis of a channel whose length is shorter, all the states of derivative channels whose length is longer cannot be considered.

Accordingly, the number of states considered for Viterbi decoding should be determined on the basis of a channel whose impulse response length is longer among the channels or derivative channels. Thus, all possible cases can be considered.

Phase estimator 310 calculates a phase estimate value by referring to a data estimate value of ACS & PM 308, and provides the phase estimate value to BMC 306.

Here, the final phase estimate value and the data estimate value are determined by a survival path value determined based on the branch metric value calculated in BMC 306 and a previously calculated state metric value. By doing so, estimation reliability is enhanced.

Meanwhile, the final phase estimate value of ACS & PM 308 is provided to loop filter 312.

Loop filter 112 generates a control signal corresponding to the phase estimate value provided by the ACS & PM 308. The control signal is converted into an analog control signal by DAC 314 and the analog control signal changes the oscillation frequency of VCO 316.

Since ADC 302 performs a sampling operation in synchronization with the clock signal generated in VCO 316, timing errors can be compensated by controlling the oscillation frequency of VCO 316.

Where a phase error is determined, the apparatus of FIG. 3 uses not only a current signal, but also all past signals such that a determination can be made with high reliability.

Also, even in phase estimation, the apparatus of FIG. 3 can increase reliability by using the same method as the data estimation of a Viterbi decoder. In particular, the result of data estimation and the result of phase estimation are commonly used, such that the reliabilities of the estimations can be enhanced further.

Figure 7A:
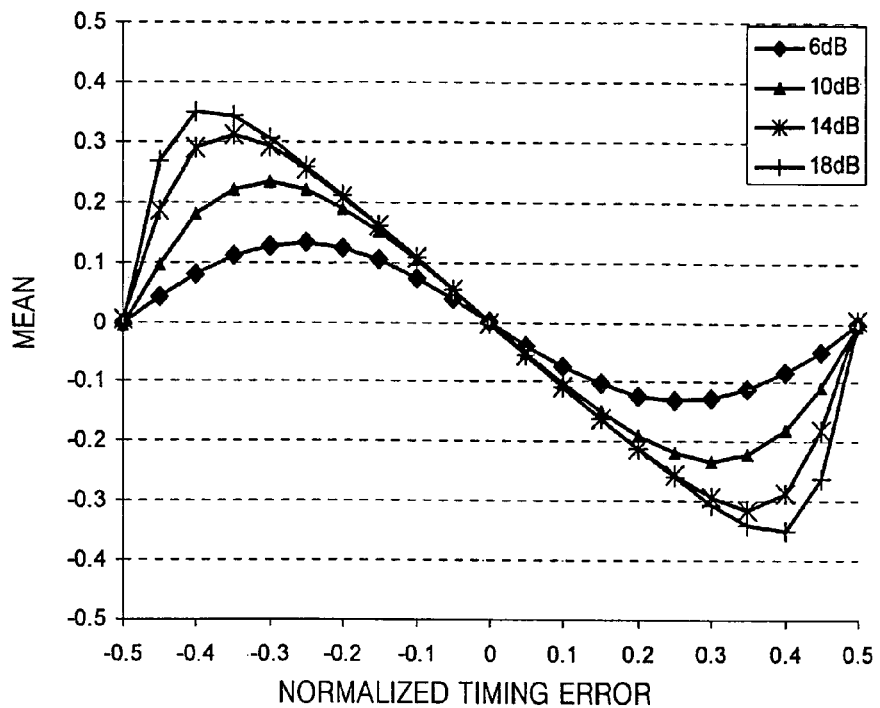
FIGS. 7A and 7B are graphs showing the results of simulations with in terms of the mean of timing errors.
Figure 7B:
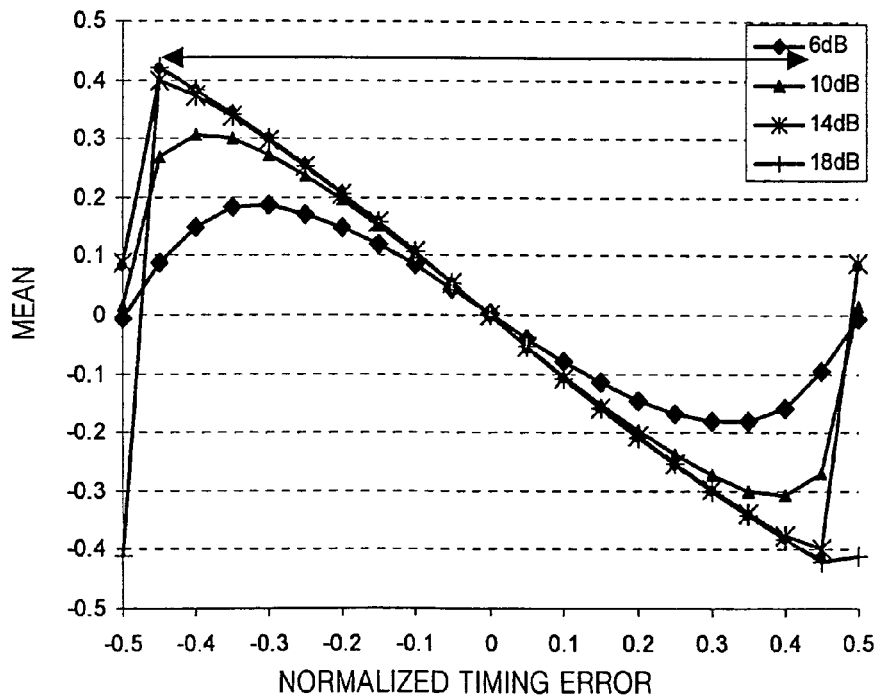

FIGS. 7A and 7B are graphs showing the results of simulations in terms of means of timing errors. In particular, FIG. 7A shows means of timing errors measured using a conventional method involving minimum mean squared error (MMSE) estimation and FIG. 7B shows means of timing errors measured using a method according to an embodiment of the present invention involving phase estimating maximum likelihood (PEML). In FIGS. 7A and 7B, actual normalized timing errors are shown on the x-axis and mean measured timing errors are shown on the y-axis. Accordingly, an ideal timing error estimator would generate a straight line in FIGS. 7A and 7B.

In both FIGS. 7 and 8, the labels "6 dB~18 dB" denote signal-to-noise ratios (SNR) of signals for which the errors are estimated. The SNRs are represented on a decibel (dB) scale. The "timing errors" in FIGS. 7 and 8 are normalized phase errors, where "−0.5" corresponds to "−π" and "+0.5" corresponds to "+π" in phase. The timing errors are measured in the simulation at the input of loop filter 312. In each simulation represented in FIGS. 7 and 8, the output of loop filter 312 is set to represent a constant phase error.

Figure 8A:
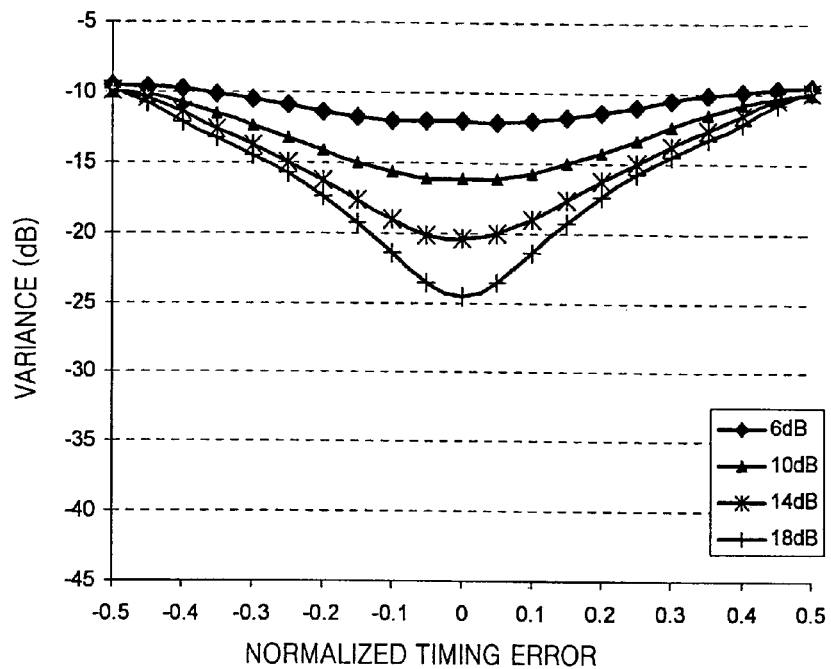
FIGS. 8A and 8B are graphs showing the results of simulations in terms of variance of timing errors.
Figure 8B:
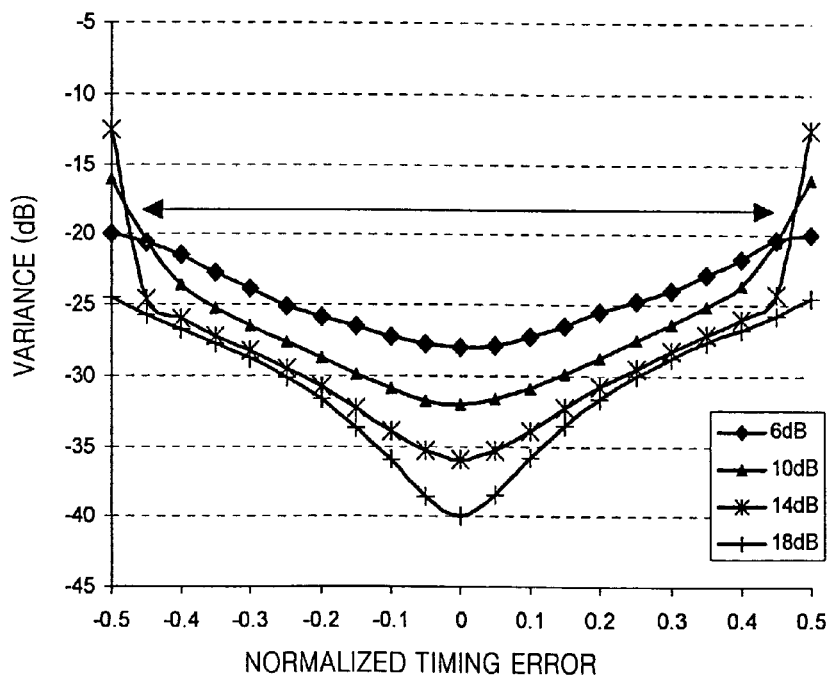

FIGS. 8A and 8B are graphs showing the results of simulations in terms of variance of timing errors measured using the conventional MMSE method and the PEML method according to an embodiment of the present invention, respectively. The variance in FIGS. 8A and 8B is measured based on the means illustrated in FIGS. 7A and 7B. In FIGS. 8A and 8B, it can be seen that the variance is improved by the method according to an embodiment of the present invention.

Figure 9A:
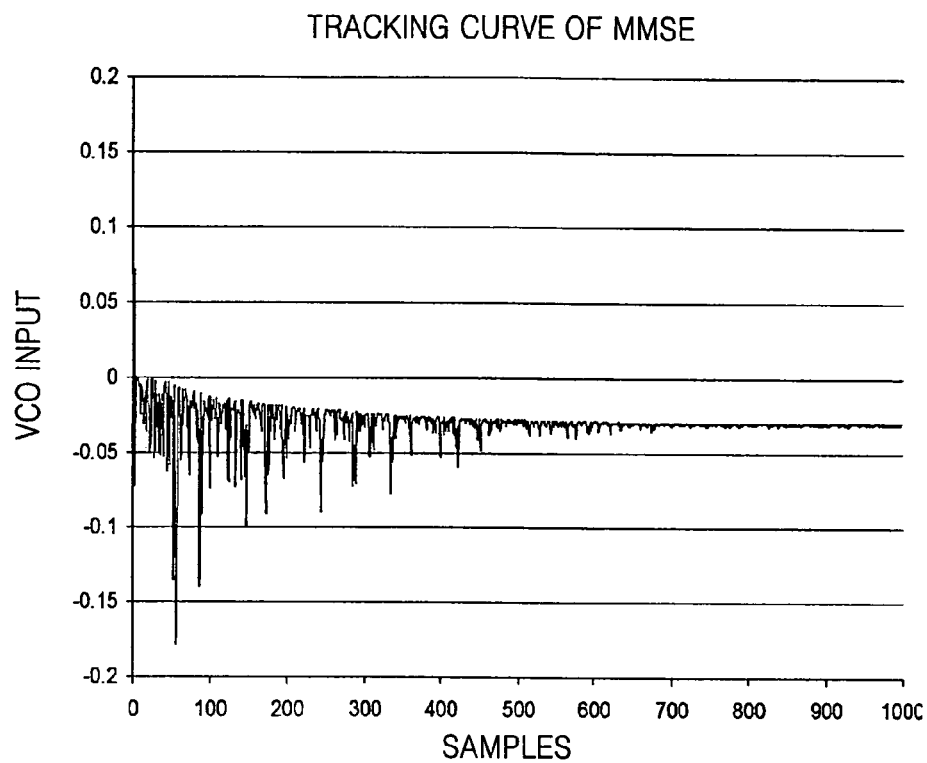
FIGS. 9A and 9B are graphs showing the results of simulations in terms of tracking performance.
Figure 9B:
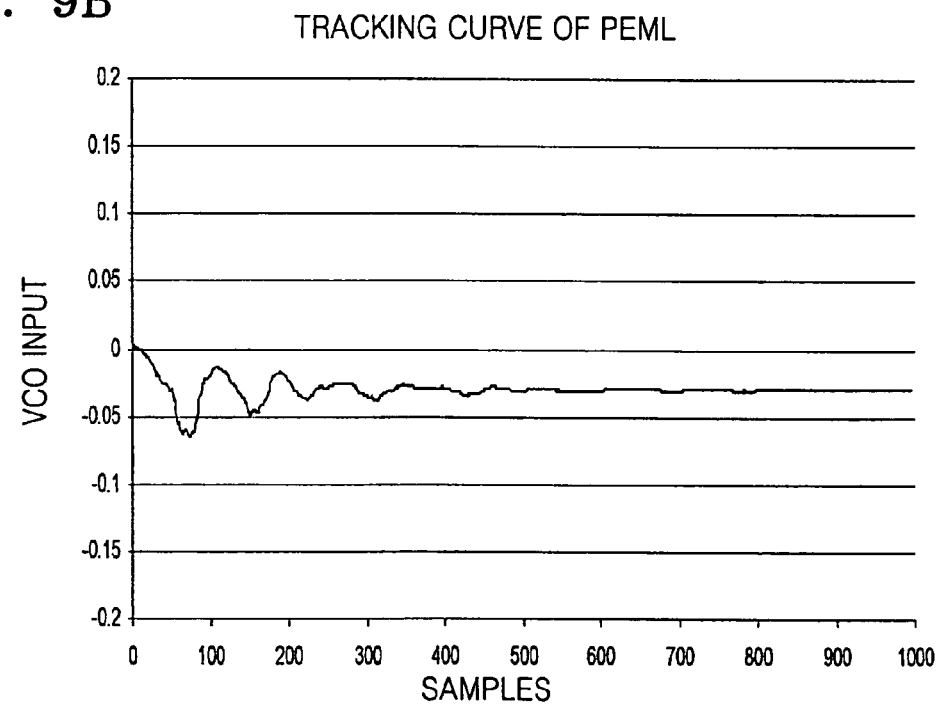

FIGS. 9A and 9B are graphs showing the results of simulations in terms of tracking performance. FIG. 9A illustrates the tracking performance of the conventional MMSE method and FIG. 9B illustrates the tracking performance of the PEML method according to an embodiment of the present invention. In general, the tracking performance can be evaluated in terms of two factors. First, the tracking performance can be evaluated based on how fast it converges to a target value, and second, on the amount of fluctuation in the tracking curve. In FIGS. 9A and 9B, the tracking curves converge to a target value almost at the same time, but the fluctuations are severe when using the conventional method. The fluctuations in FIG. 9A will result in poor jitter performance in the timing loop.

Figure 10:
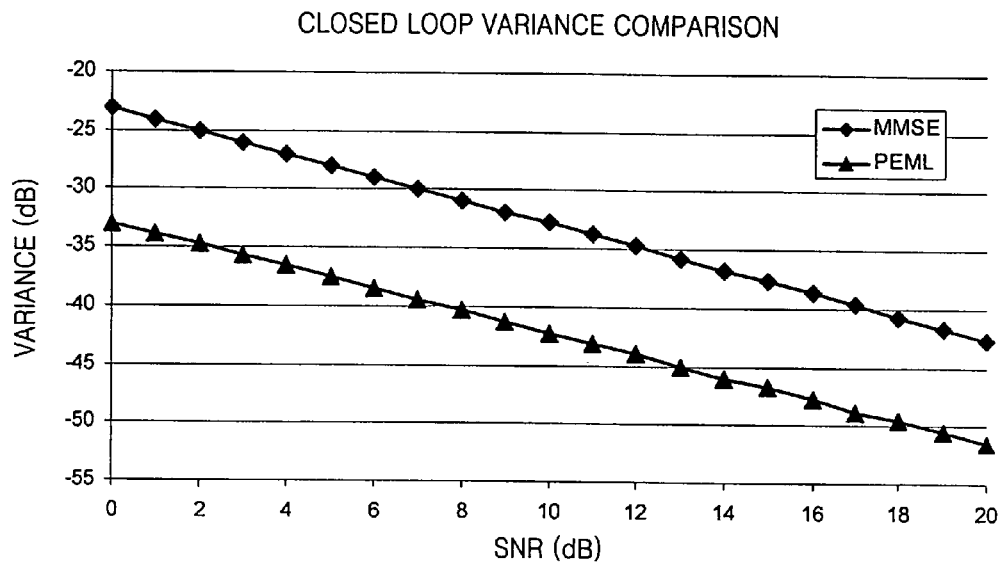
FIG. 10 is a graph showing the results of simulations in terms of steady-state jitter performance; and, FIG. 11 is a schematic diagram showing relative improvements over conventional methods provided by methods performed according to embodiments of the invention.

FIG. 10 is a graph showing the results of simulations in terms of steady-state jitter performance. In FIG. 10, the curve labeled MMSE illustrates the steady-state jitter performance of the conventional method and the curve labeled PEML illustrates the steady-state jitter performance of a method according to an embodiment of the invention. In FIG. 10, it can be seen that the jitter performance of the method according to the embodiment of the invention is better than the jitter performance of the conventional method.

Figure 11:
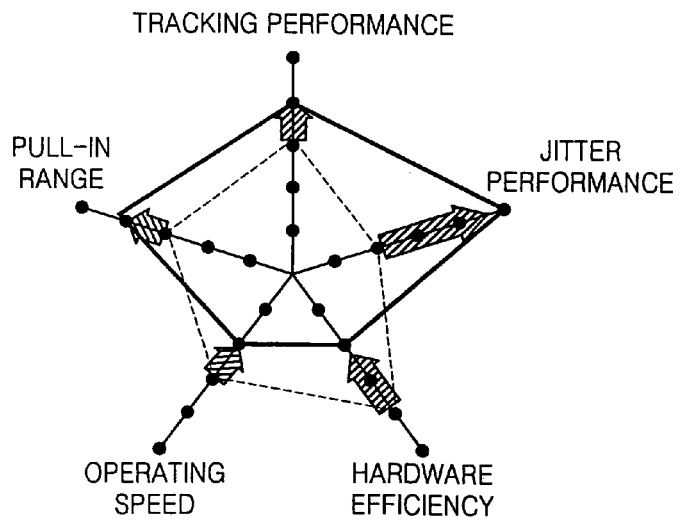

FIG. 11 is a schematic diagram illustrating improvements of the method according to the embodiment of the invention relative to the conventional method in terms of several different parameters.

Referring to FIG. 11, the embodiment of the invention improves the tracking performance, pull-in range, and jitter performance relative to the conventional method. On the other hand, the computation speed and hardware efficiency are lowered a little. However, these drawbacks are often outweighed by the improvements in the tracking, pull-in range, and jitter performances.

By using apparatuses such as those described in relation to FIG. 3, phase estimation can be performed even in environments where the quality of reproduced signals is poor due to high density data storage. In addition, stable restoration of signal timing is enabled and data recording density is enhanced. In addition, apparatuses such as those described in relation to FIG. 3 prevent faulty operation of a phase synchronization loop in a signal recorded at a high density, and noise due to timing jitters is reduced.

The foregoing preferred embodiments are teaching examples. Those of ordinary skill in the art will understand that various changes in form and details may be made to the exemplary embodiments without departing from the scope of the present invention as defined by the following claims.

What is claimed:

1. A method of calculating a current phase error between an equalized signal and an estimated data signal to control the timing of a sampling process in a system adapted to reproduce a signal transmitted through a communication channel by sampling, equalizing, and Viterbi decoding the signal, the method comprising:

recursively applying a previous phase error to a calculation of the current phase error to eliminate effects of noise from the current phase error, wherein the current phase error is calculated by recursively applying the previous phase error to an integrated value based on previous outputs of a derivative channel, wherein the derivative channel has a channel characteristic computed by taking a derivative of a channel characteristic of the communication channel.

2. The method of claim 1, further comprising:

monitoring variations in the current phase error; and, varying an interval over which the integrated value is computed based on the variations in the current phase error.

3. The method of claim 2, wherein the interval is also varied based on a noise tolerance level of the system.

4. The method of claim 2, further comprising:

applying a forgetting factor to the previous phase error, wherein the forgetting factor varies according to the interval.

5. A signal reproducing apparatus, comprising:

an analog-to-digital converter (ADC) adapted to sample a signal transmitted through a communication channel to produce a sampled signal;

an equalizer adapted to equalize the sampled signal to produce an equalized signal;

a data estimator adapted to estimate a value of the signal transmitted through the communication channel based on the equalized signal to produce an estimated signal;

a phase estimator adapted to calculate a current phase error between the equalized signal and the estimated signal; and, a loop filter adapted to control an oscillation frequency of an oscillator adapted to generate a sampling clock for the ADC based on the current phase error calculated by the phase estimator;

wherein the phase estimator calculates the current phase error based on a previous phase error and the phase estimator calculates the current phase error by recursively applying the previous phase error to an integrated value based on previous outputs of a derivative channel, wherein the derivative channel has a channel characteristic computed by taking a derivative of a channel characteristic of the communication channel.

6. The apparatus of claim 5, wherein the phase estimator monitors variations in the current phase error and varies an interval over which the integrated value is computed based on the variations in the current phase error.

7. The apparatus of claim 6, wherein the phase estimator also varies the interval based on a noise tolerance level of the signal reproducing apparatus.

8. The apparatus of claim 6, wherein the phase estimator applies a forgetting factor to the previous phase error, wherein the forgetting factor varies according to the interval.

9. A method of reproducing a signal transmitted through a communication channel, the method comprising:

sampling the transmitted signal to produce a sampled signal;

equalizing the sampled signal to produce an equalized signal;

Viterbi decoding the equalized signal to produce an estimated data signal, wherein the Viterbi decoding comprises calculating branch metrics based on estimated phase errors of the equalized signal;

calculating additional estimated phase errors based on the calculated branch metrics;

calculating an estimated phase error used in a loop filter based on a phase estimate value corresponding to a survival path selected during the Viterbi decoding; and, controlling a sampling time used to sample the transmitted signal based on the estimated phase error used in the loop filter, wherein the number of states used in the Viterbi decoding is determined based on the length of the communication channel and the length of a derivative communication channel whose impulse response is computed by differentiating the impulse response of the communication channel.

10. The method of claim 9, wherein said estimated phase errors are calculated by recursively applying respective previous phase errors to integrated values based on previous outputs of a derivative channel, wherein the derivative channel has an impulse response computed by differentiating an impulse response of the communication channel.

11. The method of claim 10, further comprising:

monitoring variations in the estimated phase errors; and, varying respective intervals over which the integrated values are computed based on the variations in the estimated phase errors.

12. The method of claim 11, wherein the intervals are also varied based on a noise tolerance level of an apparatus performing the method.

13. The method of claim 11, further comprising:

applying a forgetting factor to one or more of the previous estimated phase errors, wherein the forgetting factor varies according to the interval.

14. The method of claim 9, wherein said estimated phase errors are computed by applying respective previous estimated phase errors to integrated values based on previous outputs of the derivative channel.

15. A signal reproducing apparatus, comprising:

an analog-to-digital converter (ADC) adapted to sample a signal transmitted through a communication channel to produce a sampled signal;

an equalizer adapted to equalize the sampled signal to produce an equalized signal;

a branch metric calculator & phase compensator (BMC) adapted to calculate branch metrics based on the equalized signal and corresponding estimated phase errors and to output the branch metrics and corresponding estimated phase values;

an add compare selection & path memory (ACS & PM) adapted to compute path metrics based on the branch metrics and estimated phase values output by the BMC and to output an estimated data signal and a previous estimated phase error based on a survival path derived from the path metrics;

a phase estimator adapted to calculate a current estimated phase error to be applied to the BMC based on the previous estimated phase error output by the ACS & PM; and, a loop filter adapted to control an oscillation frequency of an oscillator used to control the timing of the sampling performed by the ADC, wherein the loop filter controls the oscillation frequency based on the previous estimated phase error output by the ACS & PM.

16. The apparatus of claim 15, wherein the phase estimator calculates the estimated phase error by recursively applying the previous estimated phase error to an integrated value based on previous outputs of a derivative channel, wherein the derivative channel has a channel characteristic computed by taking a derivative of a channel characteristic of the communication channel.

17. The apparatus of claim 16, wherein the phase estimator monitors variations in the current estimated phase error and varies an interval over which the integrated value is computed based on the variations in the current estimated phase error.

18. The apparatus of claim 17, wherein the phase estimator also varies the interval based on a noise tolerance level of the signal reproducing apparatus.

19. The apparatus of claim 18, wherein the phase estimator applies a forgetting factor to the previous phase error, wherein the forgetting factor varies according to the interval.

* * * * *